(12) United States Patent
Stuart

(10) Patent No.: US 8,439,523 B2
(45) Date of Patent: May 14, 2013

(54) LASER ENERGY SOURCE DEVICE

(76) Inventor: Martin A. Stuart, Burbank, CA (US)

( * ) Notice: Subject to any disclaimer, the term of this patent is extended or adjusted under 35 U.S.C. 154(b) by 0 days.

(21) Appl. No.: 13/478,605

(22) Filed: May 23, 2012

(65) Prior Publication Data

US 2012/0230048 A1    Sep. 13, 2012

Related U.S. Application Data

(63) Continuation of application No. 12/763,437, filed on Apr. 20, 2010, now Pat. No. 8,220,965, which is a continuation of application No. PCT/US2008/081137, filed on Oct. 24, 2008.

(60) Provisional application No. 61/000,228, filed on Oct. 25, 2007.

(51) Int. Cl.
  *G02B 27/20*  (2006.01)
(52) U.S. Cl.
  USPC ........... 362/259; 362/553; 362/268; 362/278; 362/297; 362/300
(58) Field of Classification Search .................. 362/259, 362/553, 268, 278, 296.01, 297, 298, 300
  See application file for complete search history.

(56) References Cited

U.S. PATENT DOCUMENTS

| | | | |
|---|---|---|---|
| 25,421 | A | 9/1859 | Knapp |
| 3,407,294 | A | 10/1968 | Hill |
| 3,518,419 | A | 6/1970 | Humphrey |
| 3,541,323 | A | 11/1970 | Davis et al. |
| 3,619,588 | A | 11/1971 | Chambers |
| 3,796,886 | A | 3/1974 | Freeman |
| 4,589,738 | A | 5/1986 | Ozaki |
| 5,655,832 | A | 8/1997 | Pelka et al. |
| 6,782,016 | B2 | 8/2004 | Braiman et al. |
| 6,813,069 | B2 | 11/2004 | Rice et al. |
| 6,826,224 | B2 | 11/2004 | Yuri et al. |
| 6,963,678 | B2 | 11/2005 | Werkheiser et al. |
| 7,055,991 | B2 | 6/2006 | Lin |
| 7,203,210 | B2 | 4/2007 | Sox et al. |
| 7,212,553 | B2 | 5/2007 | Starodoumov et al. |
| 8,220,965 | B2 * | 7/2012 | Stuart .......................... 362/259 |

* cited by examiner

*Primary Examiner* — Ismael Negron
(74) *Attorney, Agent, or Firm* — Pearne & Gordon LLP

(57) ABSTRACT

A laser device including a concave mirror converging beamlets from a plurality of high efficiency diode lasers to a focal point, an integrating convex mirror placed at or near the focal point reflects a first portion of the beamlets back to the concave mirror and allows a second portion through to a light transmitter. The second portion of beamlets exists the light transmitter as a homogenized uniform laser beam having substantially uniform convergence and focus.

37 Claims, 3 Drawing Sheets

LASER ENERGY SOURCE DEVICE

CROSS-REFERENCES TO RELATED APPLICATIONS

This application is a continuation of application Ser. No. 12/763,437 that was filed on Apr. 20, 2010, which was a continuation of PCT application serial number PCT/US08/81137 filed on Oct. 24, 2008, which claims the benefit of U.S. provisional application Ser. No. 61/000,228, filed on Oct. 25, 2007, all incorporated herein by reference.

BACKGROUND OF THE INVENTION

Lasers have various applications. The determination of any particular application is dependent on both the power and the beam characteristics. Pulse length, energy per pulse, polarization, and coherence length all play a part in the final outcome of the chosen application. Although there are many different types of lasers, as well as many different applications, of particular usefulness for many applications are diode lasers.

Diode lasers have high electrical efficiency and can be set up in an array pattern which can then be scaled to produce a high power. In the past, when such an arrangement was attempted, each emitter (usually 1 of 50 per cm bar, put into a stack) has produced a beam with a separate, differing wavelength (i.e.: color), coherence length, and divergence per emitter.

Laser diode power modules are known to change their peak output frequency with temperature variants, which naturally occur in arrays of laser diodes, typically at a rate of 0.3 nanometers per degree C. This often causes the entire array to operate at different frequencies from the point of turn-on until they have reached overload, with potentially negative results.

Across each emitter bar there is typically a temperature difference from edge to center to opposite edge as electrical power is directed to the device and water is utilized in the prior art in an attempt to remove the temperature differentials. This results in a corresponding color output difference in commercially available diode laser stacks or modules. The effect means that as one attempts to focus this light to a point, each emitter will focus to a different point or at a different distance from the lens. This can be a particular problem if the laser is to be focused miles, hundreds of miles, or thousands of miles away.

Due to these factors, the quest to produce a simple device utilizing these diode lasers producing a useful, single output beam has, to date, eluded the scientific and technology worlds. Other methods have been tried and have had success in this goal. This has limited the usefulness of diode lasers for a number of useful applications, including high-power applications. The prior art diode lasers have not produced a useful, simple to implement, single output beam device, and such a result has eluded the scientific and technology worlds. It would be useful to provide a device that overcomes one or more of these problems.

Various prior art methods of collating the outputs of laser emitters have bee used with various levels of success, and all with substantial shortcomings. U.S. Pat. No. 6,782,016, incorporated by reference, discloses injection synchronizing a plurality of pulsed broad area lasers using a signal source; modulating the plurality of pulsed broad area lasers using the signal source; and externally coupling the plurality of pulsed broad area lasers. U.S. Pat. No. 6,813,069, incorporated by reference, discloses a refractive index matched MOPA scaled fiber array laser. U.S. Pat. No. 6,826,224, incorporated by reference, shows a high power semiconductor array that outputs wavelength matched, phase matched light which uses leakage between individual emitters next to each other in a bar. U.S. Pat. No. 7,203,210, incorporated by reference, uses a liquid crystal light valve on each diode emitter. U.S. Pat. No. 7,212,553, incorporated by reference, uses feedback to frequency lock the diode laser to 1 nanometer bandwidth, for a fiber laser array. But none of these solutions are adequate for all current needs.

SUMMARY OF THE INVENTION

Provided are a plurality of embodiments the invention, including, but not limited to, a convenient, new optically and mechanically innovative method of making a laser system with the high efficiency of diode lasers and the high quality beam characteristics of crystal gain medium single mode laser.

Also provided is a suggested design that would allow for a forty percent or higher on target delivery of electrical to light energy for military applications that is robust and cheap to operate.

Still further provided is a suggested enabling technology to provide for deep sea or land high-speed drilling and tunneling system capable of accessing the oil reserves in the deeper section of the Gulf of Mexico. The device is compact enough to be lowered into position on a robotically operated vehicle, in sea applications, or the energy can be fed into a suitable fiber delivery system, for example.

Accordingly is provided a device for generating a focused laser beam, with the device comprising: a plurality of laser diodes formed into an array, each of the diode lasers for emitting a laser beamlet operated to produce a plurality of beamlets; a first concave reflecting mirror for converging the beamlets to a focal point; an integrating convex mirror placed at or near the focal point, the integrated mirror adapted for reflecting a first portion of the beamlets back toward the first reflecting mirror and for allowing a second portion of the beamlets through the integrating mirror; and a light transmitter adapted for transmitting the second portion of the beamlets from the integrating mirror, wherein the second portion of beamlets exit the light transmitter as a homogenized uniform laser beam having substantially uniform convergence and focus.

Further provided is the above device further comprising a beam director subsystem including: a focusing mirror for receiving the homogenized uniform laser beam to reflect a divergent laser beam; and a second concave reflecting mirror for receiving the divergent laser beam for reflection toward a target.

Also provided is the above device wherein the focusing mirror is a deformable convex focusing mirror and wherein the device further comprises a controller for controlling a deformation of the deformable convex focusing mirror.

Still further provided is a method of directing a laser beam to a target, with the method comprising the steps of:

generating a plurality of originating beamlets using a plurality of individual beam generators;

reflecting a first portion of the beamlets back toward the originating beamlets in a manner such that the first portion of beamlets overlap the originating beamlets to frequency lock the dominant gain profile of the generators and lock the coherence length of the beamlets to the dominant phase profile; and focusing and directing a second portion of the beamlets that are locked in frequency and coherence as the laser beam toward the target.

Also provided is the above method further comprising the step of diverging and further focusing the laser beam prior to directing the laser beam toward the target.

Also provided are additional embodiments of the invention, some, but not all of which, are described hereinbelow in more detail.

BRIEF DESCRIPTION OF THE DRAWINGS

The features and advantages of the examples of the present invention described herein will become apparent to those skilled in the art to which the present invention relates upon reading the following description, with reference to the accompanying drawings, in which.

DETAILED DESCRIPTION OF THE EXAMPLE EMBODIMENTS

Figure 1:
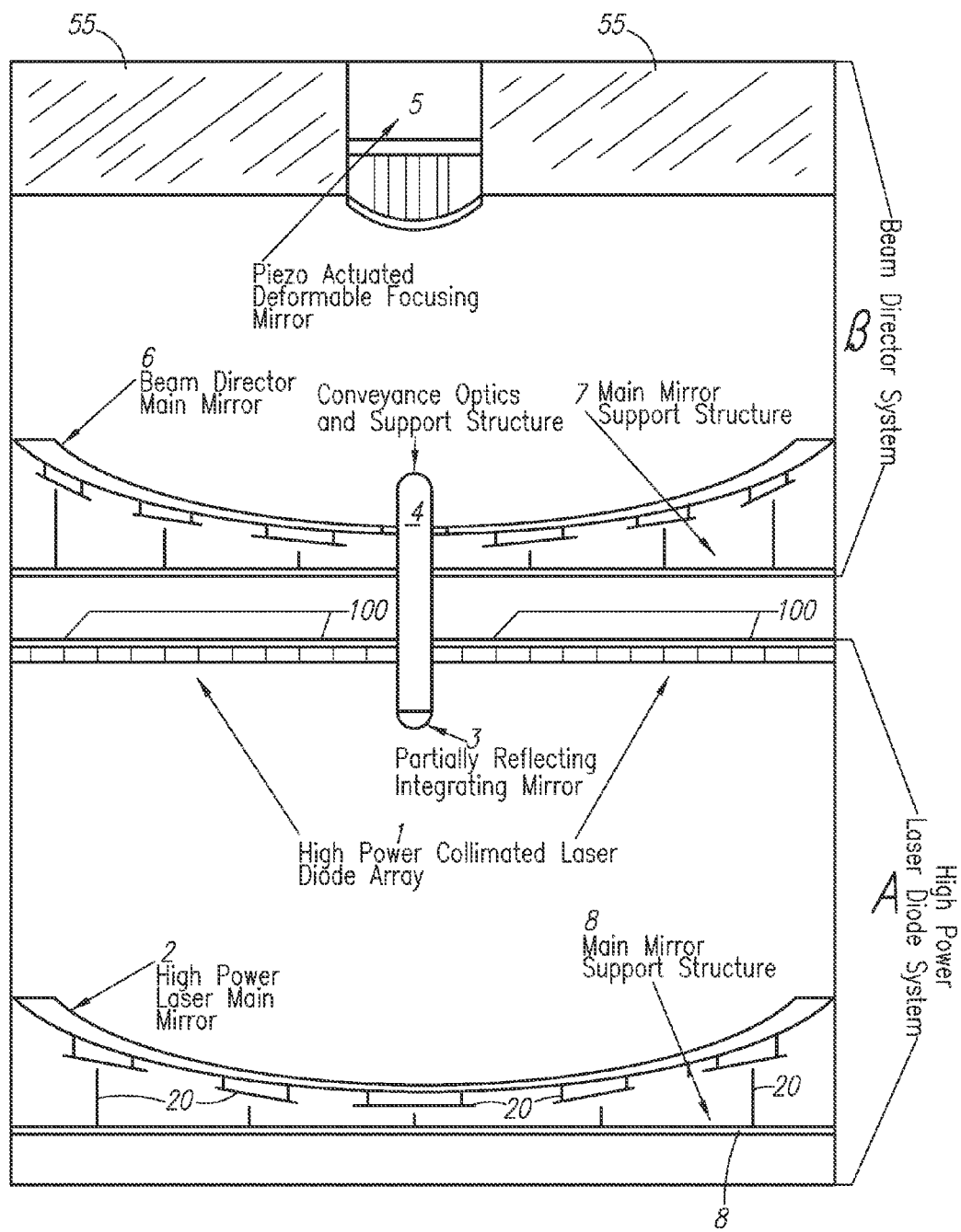
FIG. 1 illustrates the system components forming the apparatus of the present invention.

This application describes embodiments of a device (or system of devices/components) and a method that can allow power scaling to just about any level desired, from lower power applications to high-power applications, for arrays of various laser emitters. The beam provided by use of these devices/methods will be of a single wavelength and coherence length, which makes it very useful and adaptable.

To create such a system, diode laser power bars can be utilized. Such diode bars are high-power semiconductor lasers (laser diodes), containing a one-dimensional array of broad-area emitters. They typically contain between 20 and 50 emitters, each being e.g. 100 µm wide. The diode laser power bars are then fabricated into stacked arrays, such as, for the purpose of illustration, 2 cm wide×a chosen length, but other dimensions can be used where appropriate for the given application. For the purposes of an example used in this application, a fabricated size of 2 cm wide×5 cm high with 20 bars mounted within the housing can be used.

Once the size of the power bar array has been designated, the array or arrays are then mounted onto a structural support in such a way that all of the arrays are parallel.

Once mounted, the array will be fitted with lenses in order to collimate both the X and Y (or fast and slow) axes of each beam in the array. This causes the beams to be projected in what are nearly parallel "beamlets" which are perpendicular to the power bar array.

At a designated distance in front of the beam array a concave, high reflecting mirror is placed. The mirror is constructed with a focal length such that the focal point is on the plane of the power bar array.

Intercepting the return beam coming from the concave integration mirror is a convex optical mirror which is at least partially reflective. The convex surface of this integration mirror ultimately reflects a portion of the beamlets from all of the converging array of beamlets back to the original power beam array. The curve of the integration mirror is chosen so that the resulting reflection beam is larger than what was sent out as the originating emitted beamlets. The returning (reflected) beams or array of beamlets is large enough to overlap the other emitters on the diode laser array" and the adjacent modules in the array. This integration mirror is designed as a partially reflecting, integrating feedback mirror. The reflectivity of this feedback mirror is determined by the gain characteristics of the chosen lasers (diode or fiber). The output frequency desired will determine the materials used in the diodes of the laser array. As other parts of the spectrum are chosen, such as eye safe high water absorption lines, the gain is lower for these devices so a higher reflectivity is required.

When each "beamlet" emitter can "see" (interact with) the other emitters, the entire array becomes frequency locked to the dominant gain profile of the arrays, and the coherence length is also locked to the dominant phase profile of the array. If the implementor wishes to produce a particularly line narrowed beam, a seed laser utilizing a Littman-Metcalf extended cavity diode laser, operating in the same part of the spectrum as the main diode array, can be employed. This configuration is called a master oscillator power amplifier or MOPA configuration. This ECDL would have its seed beam directed into a module at a convenient location, such as near the perimeter of the array. This module would be the first to be turned on in the array, and the adjacent modules would also sequentially be turned on or energized in the array a few microseconds apart. This would proceed at turn-on until the entire array had been activated.

In the event that an implementor wished to amplify a very short pulse, such as a pulse that had a duration of one picosecond or less, the seed pulse would be directed towards the integrating feedback mirror so as to irradiate the array at the same. In this configuration the distance to the feedback mirror would be made the same by mounting the modules on stepped platforms in the array so as to be at the same radius from the feedback mirror. This effect would take place also by using a longer mirror to array distance.

The remaining converging beam that is not reflected passes through the integration mirror and then can be directed into one or more light transport conduits (e.g., fiber optics, a waveguide, or collimating optics). The chosen conduit is run through the center of the array. This constitutes the output of the array as each of the beamlets has been both frequency and phase locked to each other.

A separate beam director system can be mounted adjacent to the emitter structural support system, in which case a compact, very high power laser device is realized. The beam director, which is made up of both the beam expanding optical elements and the refocusing optical elements, allows the output optical energy to be focused at the desired distance onto a desired target.

The device as shown in the example embodiments includes a feedback optical element that couples a sufficient amount of laser energy into surrounding laser emitters, causing a chain reaction effect. Because ultimately all of the emitters are coupled together by the design of the device, this effect can be used for a device utilizing any size array that the designer and/or implementor would choose to construct.

The spectral output from a single diode laser emitter that could be utilized for practical use might be about 2-3 nanometers wide or about 10 gigahertz, in a bell shaped output curve. Within that bell curve are closely spaced spikes with about 150 megahertz separation. An extended cavity diode laser (ECDL) would use a diode laser emitter, similar to a laser pointer but more powerful, which bounces the beam off a diffraction grating at an oblique angle, a common configuration is called a Littman-Metcalf resonator. These devices emit with a line-width of 120 kilohertz or less.

The line-width from a ECDL is less than the spike or mode spacing of 150 megahertz, thus if a whole array was encouraged into making only that narrow line-width, the laser could be focused to the smallest possible spot at the farthest possible distance. Examples include about three miles near the ocean (haze), 6-8 miles in the dessert (dust), 160 miles at about ten thousand feet altitude or even at a range of 2,000 miles or more from outer space.

Lasers have a gain of a certain amount per centimeter of gain material. Diode lasers operating in the near infrared part of the spectrum typically have a gain of about 3,000 per centimeter, with power bars being usually 0.10-0.15 cm. width, but because such devices have a rear mirror, a photon entering the "front" will pass through the gain section twice before leaving the diode laser.

The designs provided in the example embodiments can be narrowed to the 2-3 nm bandwidth. The ECDL is utilized as a seed laser, within the 20 milliwatt (up to several watts or more) seed beam being reflected into a first module, where the output from this first stack will be line narrowed. A main mirror reflection will be directed onto a feedback mirror (which is a lens that can be made with a dielectric coating to a specific reflectivity or of uncoated glass or clear sapphire @ 4.5% & 10% reflection, respectively, for example, though diamond is also an option at about 20% reflection, and can handle very high power levels due to high thermal conductivity). The backward reflecting beam then spreads or diverges onto a larger part of the array.

After several bounces of the beams (beamlets), the whole array becomes frequency locked to the 120 kilohertz output of the ECDL seed laser. This is referred to as Master Oscillator Power Amplifier or MOPA type configuration.

An array of fiber lasers could be utilized instead of the diode emitters, if a feedback mirror concept with a seed laser is used as an option. The fiber lasers act like the diode lasers in the MOPA example. Where in this example the line-width will be narrowed and the array would be substantially coherent and single mode in operation (each of those spikes competes with each other to grab as much energy as possible in the gain medium, whether diode or fiber). A problem might arise where fiber lasers are out of phase with each other (i.e., in multi-mode output). When this happens, the beam could be focused to a spot that is several times the diameter of a diffraction limited spot, with a resulting lower beam intensity.

Thus, the design of the present invention allows the diode array to continue to couple an output that is both frequency locked and phase locked, and therefore not temperature dependant, which can avoid the temperature-frequency drift or instability problem of the prior art.

Figure 2:
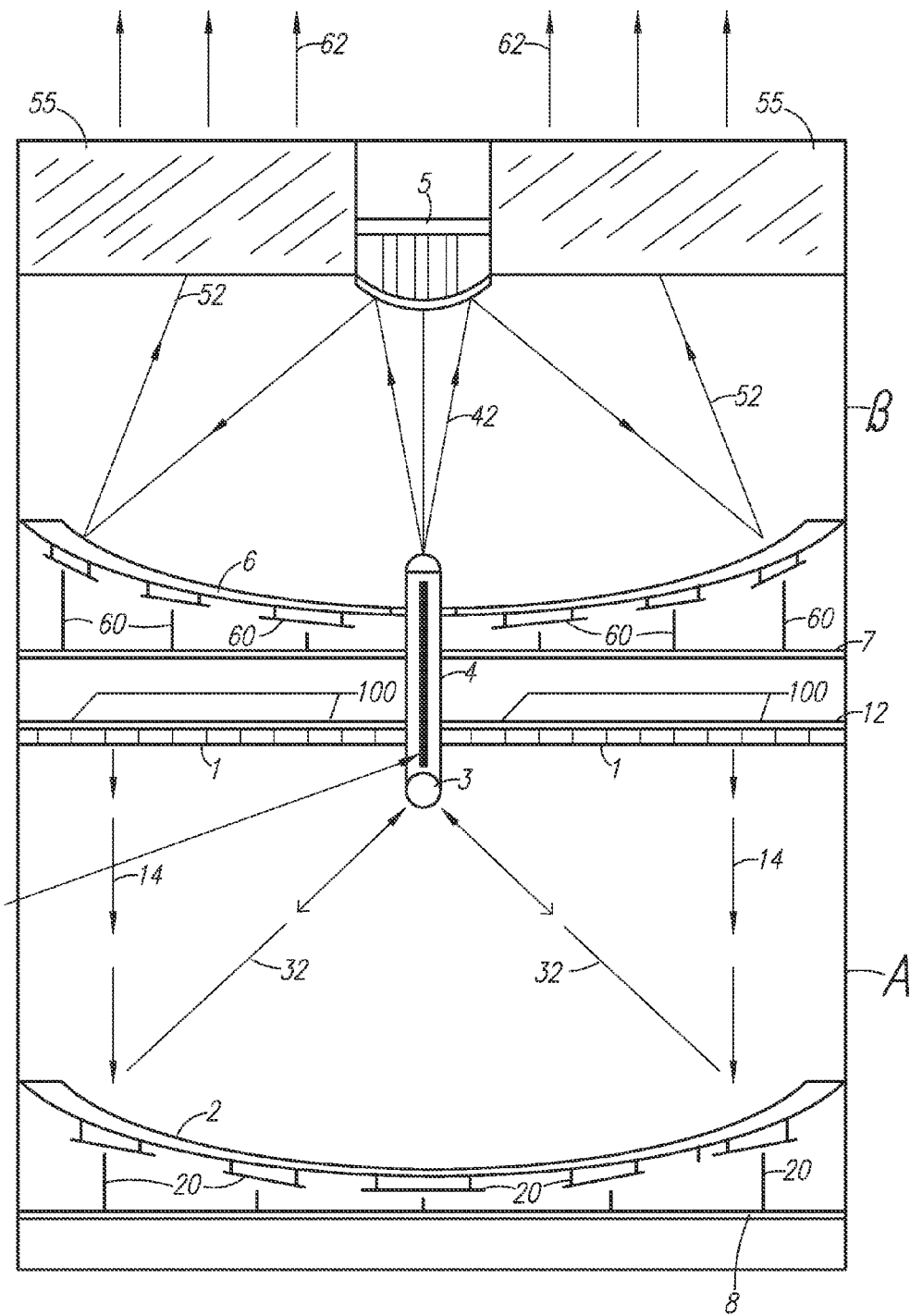
FIG. 2 illustrates the method of operation of the system components including additional support equipment.

FIGS. 1 and 2 show various features of the example embodiment shown in two parts, a laser system A and a beam focusing system B. Commercially available collimated continuous wave or pulsed laser diode modules 1 are provided in the center of the structure. In the example, a 2 cm wide by 3.5 cm high micro-channel cooled array is chosen to be attached to a structural support plate 12 constructed of stainless steel. This allows the cooling and electrical connections to be made from the rear of each diode array module as shown in FIG. 2. The divergence of these modules can typically be reduced to 4°.

The high power laser main mirror 2 is located to receive laser energy "beamlets" 14 from the diode array. The main mirror 2 can utilize a standard diameter with a custom curve, diamond turned ceramic or metal plate made from a thermally invariant ceramic or thermally stable alloy such as beryllium. This ceramic plate is finished with a 99.9% dielectric coating which is the high reflecting surface. This main mirror is then supported in the device with an appropriate support structures 8, 20.

One purpose of the main mirror 2 is to converge the beamlets 14 from the array onto the partially reflecting integrating mirror 3. The ceramic or metal alloy plate is chosen due to its ability to maintain its shape over a span of large temperature changes. Although commercially available materials can be utilized to construct this mirror, the specific shape of the main mirror 2 is chosen in order to converge the beamlets 14, such as in the manner described in this disclosure.

The partially reflecting integrating mirror 3 receives the reflected beamlets 32. The convex optic of the integrating mirror 3 is designed to reflect at least a part (one to fifty %) of the light of the beamlets 32 back toward the high power laser diode array modules 1, and to transmit the remaining beamlets through the integrating mirror 3 to a light transmitter (waveguide).

The gain of each laser diode emitter 100 for the example embodiment is about $3000/cm^{-1}$ for near infrared devices. If small amounts of energy from an adjacent emitter are coupled into another emitter, then both emitters will become frequency locked and phase locked to each other, an effect that is utilized by the invention. The conveyance optics could use either a hollow waveguide, or a large mode area fiber optic, as a light transmitter 4 to transmit the laser light from laser chamber A to beam director chamber B. The light transmitter 4 is supported in the device with an appropriate support structure.

The purpose of this optic design is to homogenize all of the beamlets 32 into a single, uniform beam 42 with uniform divergence characteristics. The light transmitter, coupled with the partially reflection integrating mirror 3, produces the final beam characteristics allowing the beam director to transmit and focus the output from the array 1 at a predictable distance.

Several different technologies can be utilized for the light transmitter 4. If the transmitter 4 is just a hollow conduit, then the output will consist of individual beamlets passing next to each other, and thus will act exactly like each other as the subsequent system refocuses the beam (which might include adaptive optics systems to counter atmospheric distortion, for example), and a subsequent beam director (e.g., a telescope in a turret) to hit an intended target or work piece. There is a minimum diameter to which each beamlet can be focused in a design utilizing a hollow conduit, which leads to the use of a light conduit for additional beam conditioning by homogenizing the beamlets into one beam which has consistent and predictable behavior.

Using a light conduit as the transmitter 4 can homogenize the beamlets into a monolithic beam, as long as the thermal distortions in the conduit are dealt with. Liquid filled conduits can be utilized as the transmitter 4, but as the liquid gets hot, the liquid changes its density and its refractive index, and that should be compensated for. This might be done by utilizing pumped deionized water (as long as a non water absorbing color of light is used).

Still another option would be to direct each beam-let into an individual fiber for feeding the beamlet's energy to a distant beam director without having to deal with the finicky vibration sensitive optics of tube and telescope designs as part of the device.

Alternatively, a light conduit made of a rod of glass which has been made into a giant gradient index fiber optic by putting it into a bath of silver nitrate to change its refractive index across the diameter could be utilized for the light transmitter 4. This design would be an effective beam homogenizer that could handle large power levels as well. Another method of producing a gradient index optic would be to fabricate concentric tubes of glass with increasing refractive indexes then fusing them into a single solid. This is the current method of producing a fiber optic perform.

A beam director system B is provided to direct the resulting laser beam provided by the laser system A. A piezoelectric deformable convex focusing mirror can be used for the adaptive optics 5 and could be provided by a commercially available system component with a shape dependent on the system constraints. This type of focusing mirror can change its curve or effective focal length by up to 2 diopters or more. This will cause the uniform beam 42 output from the light transmitter 4 to diverge into a laser beam 52. An output dust window 55 can be provided for the beam director. In a weapon system, this would preferably be a piece of bullet proof sapphire or segments of sapphire.

Acting in conjunction with a beam director mirror 6, these two optics basically form a confocal telescope focusing system to produce a high power output laser beam 62.

The beam director mirror 6 can be made physically identical to the high power laser main mirror 2, or modifications might be provided for particular desired characteristics. In the example embodiment of FIGS. 1-2, this beam director mirror 6 is used to project the high power beam output onto the desired target.

The main mirror support structures 8, 20 and 7, 60 can use a plurality of press plates with proven 3-point contacts provided per press plate formula in its construction. A uniform pressure from multiple press plates clamps the main mirrors into their respective frames while allowing shock absorption and thermal venting from the back side of each optic. The main mirror support structure can be mechanical or pneumatic to meet system requirements chosen by the implementor. One would be more suitable for a stationary application and the other for a high stress environment.

An external cooling system and an electrical and control system connections can be provided for the device, for example at location 100, for supporting the diode array 1. The cooling system can utilize deionized water under pressure to cool the diodes. Such a system could utilize a plurality of redundant water jet pumps throttled back by bypass regulators. Such a system can utilize off-the-shelf components that are tailored to function in land, sea, or air configurations, as desired.

The external power supply and control system is also coupled to the diode array. This could utilize a commercially available device that has been custom specified for the present invention. Such devices are normally made to military specifications, and are made up of high temperature rugidized and attack hardened components. These are controlled by the "On-Off" commands of an external control system, such as a targeting radar and computer system provided in a military application. Such a system would normally be available for purchase by authorized government personnel when integrating such systems. When combined with the diode system, this control system controls the targeting and fire control output of the integrated device by sending the finalized focusing information onto a focusing control system computer 400.

The adaptive optics 5 is under the control of the main control system, and can change the focal distance of the beam director. This allows the spot size to automatically custom focus to the specified distance at which the laser operator or targeting control computer has chosen for its workpiece or target.

The present invention is not only enabled by the coupling design, but is also able to improve the output performance of a standard diode power module by use of the waveguide (or large mode area fiber) as will be described hereinbelow. This component makes the entire beam predictable for the computer-aided design of the beam director.

Figure 3:
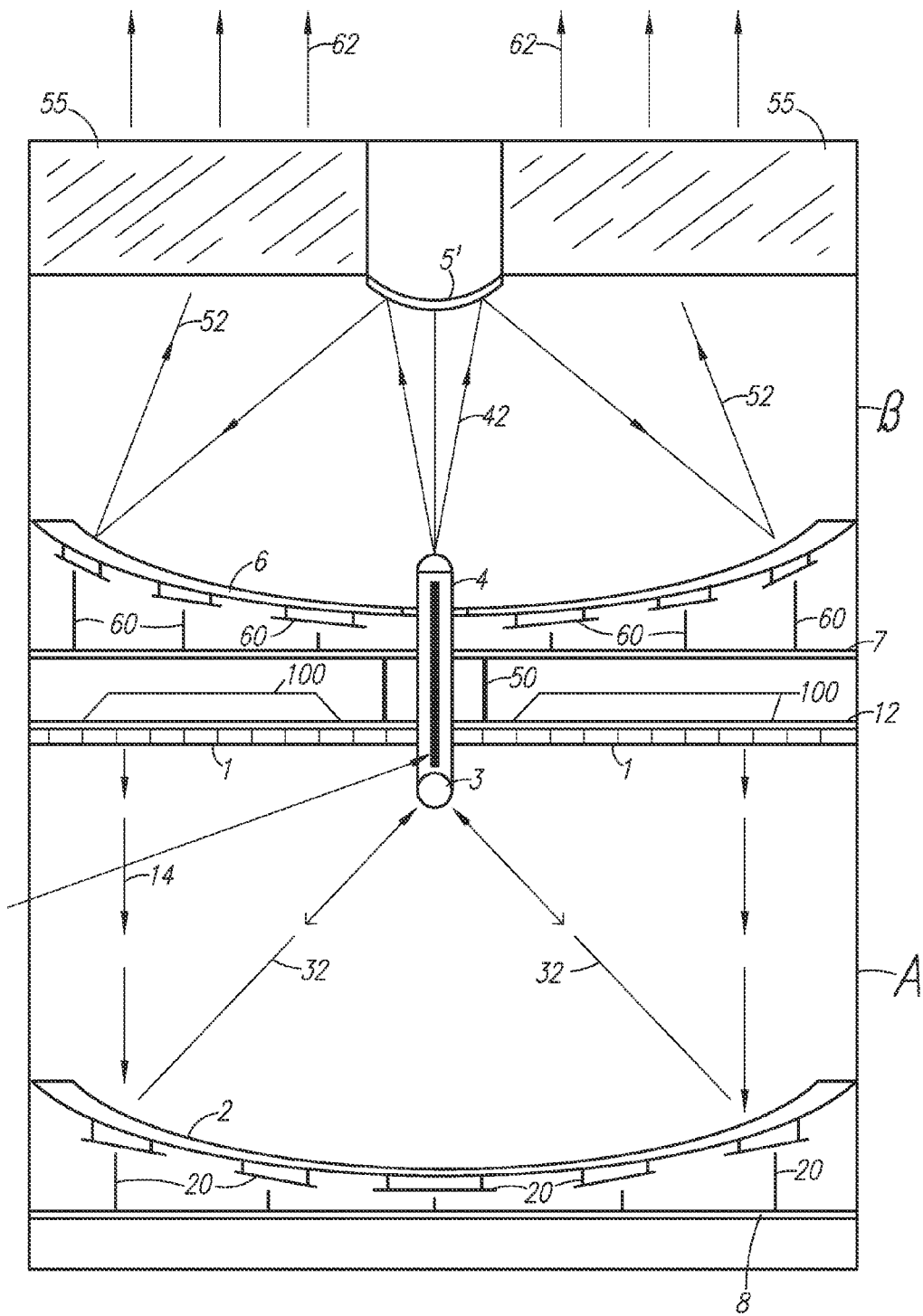
FIG. 3 illustrates another embodiment of the system components.

Another embodiment, shown by FIG. 3, provides an alternative adaptive optics system 50 configuration, using a fixed convex mirror 5'.

Conceptually, this system 50 includes four mirrors. A beam is transmitted straight up from the conduit, after being made parallel by a lens. Picture the first mirror at a 45 degree angle sending the beam to the right. Now have two identical mirrors that have a short focal point facing each other with the focal point common to both so that the light shines into the first curved mirror and sends the light into the second curved mirror. Let's say that the two curved mirrors are sending the light vertically with the light from the second curved mirror directing the light left onto the fourth mirror which sends the light again vertically.

The focal point from the first curved mirror is made shorter; then the light coming out of the second curved mirror would become convergent if nothing changed in the second mirror. Now picture the 45 degree bending mirrors being dichroic, so that they are high reflectors at the laser wavelength but transparent to other parts of the spectrum. Looking through the first mirror at the first curved mirror, a camera system would see the same thing that the beam director was looking at. If the second bending mirror is made of sapphire, it would be transparent to the mid infrared spectrum, say 1-5 u.

System Applications and Examples:

Commercial Applications:

- A 1 kw to 10 kw system would be typical for an application of cutting and/or welding light to medium metals in fabrication manufacturing.
- A 10 kw to 20 kw system would be useful as a bonder for making alloys such as in the case of powdered metal sintering when doing laser engineered net shape part fabrication. This application is mainly used in aerospace manufacturing. This system application could also be used in medium metal plate cutting or welding.
- A 20 kw to 100 kw system would be useful in ship building for heavy/thick section welding or cutting at high rates of speed.
- A 300 kw system is the range that would allow for well drilling and under water welding applications.
- Systems with 1000 kw (1 megawatt) beams would have the capacity to vaporize I-inch (2.5 cm) diameter holes through approximately 10 feet of rock per second. This would enable tunneling a 50-foot diameter hole through 100 feet of rock in a five hour period of time. (Speed levels would increase in direct proportion with each corresponding I-megawatt increase).

Military Applications: As in the commercial applications, the output is again power dependent, although the function in each of the examples given is similar in that they both function as a laser weapon system.

- A 100 kw laser designed with a range of 0.8 to 100 kilometers (0.5 to 160 miles) becomes a dominant force in military applications. Used in this application, the system could be focused onto a target (i.e. a missile, artillery launchers, or any opposing forces) to neutralize it. When directed, the system would cause the beam to vaporize the target or heat sensitive explosives before they could engage.
- A 4-megawatt laser system would be able to destroy approximately 8 targets per second at a range of up to 1600 miles (approximately 2500 kilometers).

The invention has been described hereinabove using specific examples and embodiments; however, it will be understood by those skilled in the art that various alternatives may be used and equivalents may be substituted for elements and/or steps described herein, without deviating from the scope of the invention. Modifications may be necessary to adapt the invention to a particular situation or to particular needs without departing from the scope of the invention. It is intended that the invention not be limited to the particular implementations and embodiments described herein, but that the claims be given their broadest interpretation to cover all embodiments, literal or equivalent, disclosed or not, covered thereby.

What is claimed is:

1. A device for generating a focused laser beam, said device comprising:
a main laser array including a plurality of emitting diodes formed into an array, each of said laser diodes operating in a particular spectrum for emitting a laser beamlet operated in conjunction to produce a plurality of beamlets;
at least one seed laser including an extended cavity emitting diode operating in the same particular spectrum as the diodes of the main array;
a first concave reflecting mirror for converging said beamlets to a focal point;
an integrating convex mirror placed at or near said focal point, said integrated convex mirror adapted for reflecting a first portion of said beamlets back toward said first reflecting mirror and for allowing a second portion of said beamlets through said integrating convex mirror; and
a light transmitter adapted for transmitting said second portion of said beamlets from said integrating convex mirror, wherein said second portion of beamlets exit said light transmitter as a homogenized uniform laser beam having substantially uniform convergence and focus.

2. The device of claim 1, wherein said light transmitter is comprised of a fluid-filled tube.

3. The device of claim 1, wherein said light transmitter is comprised of a hollow tube.

4. The device of claim 1, wherein said light transmitter is comprised of a plurality of fibers for transmitting individual beamlets.

5. The device of claim 1, wherein said light transmitter is comprised of a rod of glass which has been treated with silver nitrate to form a gradient index light conduit.

6. The device of claim 1, wherein said device is adapted for generating a short pulse of one picosecond or less.

7. The device of claim 1, wherein said seed laser is a Littman-Metcalf extended cavity diode laser.

8. The device of claim 1, wherein said seed laser is activated prior to any other emitting diodes to form said focused laser beam.

9. The device of claim 1, further comprising a beam director subsystem including:
a focusing mirror for receiving said homogenized uniform laser beam to reflect a divergent laser beam; and
a second concave reflecting mirror for receiving said divergent laser beam for reflection toward a target.

10. The device of claim 9, wherein said light transmitter is comprised of a fluid-filled tube, a hollow tube, a plurality of fibers for transmitting individual beamlets, and a rod of glass which has been treated with silver nitrate to form a gradient index light conduit.

11. The device of claim 9, wherein said focusing mirror is a deformable convex focusing mirror and wherein said device further comprises a controller for controlling a deformation of said deformable convex focusing mirror.

12. The device of claim 11, wherein said controller is also for controlling an "on"/"off" state of said emitting diodes of said main laser.

13. A device for generating a focused laser beam, said device comprising:
a structural support;
a laser diode array of a specific desired width and length including a plurality of emitting diodes acting as laser emitters, wherein said array is mounted onto the structural support such that the output of the laser emitters of the array is substantially parallel beamlets of laser energy;
a concave highly reflecting mirror placed at a designated distance in front of the array to receive the beamlets for reflecting and converging the beamlets of laser energy;
a convex optical mirror which is partially reflective for intercepting the reflected and converged beamlets of laser energy from said concave mirror with the convex surface of the convex optical mirror reflecting the converging array of beamlets back to the laser diode array; and
a light transmitter comprising a light transport conduit, wherein
said device further comprises a seed laser including an extended cavity emitting diode.

14. The device of claim 13, wherein the convex curve of the convex optical mirror is chosen such that the resulting reflected beam is larger than the originating beamlets so that the reflected beam overlaps the originating beamlets, permitting each beamlet emitter to interact with the other emitters such that the entire array becomes frequency locked to the dominant gain profile of the array and the coherence length is also locked to the dominant phase profile of the array.

15. The device of claim 13, wherein the light transport conduit receives at least a portion of the converging beamlets that pass through the partially reflective optical mirror such that the output of the conduit constitutes the output of the array and with each of the beamlets being both frequency and phase locked to each other into a laser beam.

16. The device of claim 13, further comprising a separate beam director system mounted adjacent to the light transport conduit to receive at least a portion of the converging beamlets to allow the output optical energy from the light transport conduit to be focused at a desired distance onto a desired target.

17. The Device of claim 13, wherein the diode laser array is comprised of a stack of arrays to increase the power output.

18. The device of claim 17, wherein the stack of arrays are mounted onto a structural support such that all of the arrays are parallel.

19. The device of claim 13, wherein the array has projected laser beams in substantially parallel beamlets.

20. The device of claim 13, wherein the light transport conduit is formed by a waveguide.

21. The device of claim 13, wherein the light transport conduit is formed by collimating optics.

22. The device of claim 13, wherein said device is adapted for generating a short laser pulse of one picosecond or less.

23. A device for generating a focused laser beam, said device comprising:
a structural support;
a laser diode array of a specific desired width and length including a plurality of emitting diodes acting as laser emitters, wherein said array is mounted onto the structural support such that the output of the laser emitters of the array is substantially parallel beamlets of laser energy;
a concave highly reflecting mirror placed at a designated distance in front of the array to receive the beamlets for reflecting and converging the beamlets of laser energy;

a convex optical mirror which is partially reflective for intercepting the reflected and converged beamlets of laser energy from said concave mirror with the convex surface of the convex optical mirror reflecting the converging array of beamlets back to the laser diode array; and a light transmitter comprising a light transport conduit, wherein said device further comprises a seed laser including a Littman-Metcalf extended cavity diode.

24. The device of claim 23, further comprising a separate beam director system mounted adjacent to the light transport conduit to receive at least a portion of the converging beamlets to allow the output optical energy from the light transport conduit to be focused at a desired distance onto a desired target.

25. The Device of claim 23, wherein the diode laser array is comprised of a stack of arrays to increase the power output.

26. The device of claim 23, wherein the stack of arrays are mounted onto a structural support such that all of the arrays are parallel.

27. The device of claim 23, wherein the array has projected laser beams in substantially parallel beamlets.

28. The device of claim 23, wherein the light transport conduit is formed by a waveguide.

29. The device of claim 23, wherein the light transport conduit is formed by collimating optics.

30. The device of claim 23, wherein said device is adapted for generating a short laser pulse of one picosecond or less.

31. The device of claim 23, wherein the convex curve of the convex optical mirror is chosen such that the resulting reflected beam is larger than the originating beamlets so that the reflected beam overlaps the originating beamlets, permitting each beamlet emitter to interact with the other emitters such that the entire array becomes frequency locked to the dominant gain profile of the array and the coherence length is also locked to the dominant phase profile of the array.

32. The device of claim 23, wherein the light transport conduit receives at least a portion of the converging beamlets that pass through the partially reflective optical mirror such that the output of the conduit constitutes the output of the array and with each of the beamlets being both frequency and phase locked to each other into a laser beam.

33. A device for generating a focused laser beam, said device comprising:

a main laser array including a plurality of emitting diodes formed into an array, each of said diodes operating in a particular spectrum for emitting a laser beamlet operated in conjunction to produce a plurality of beamlets;

a seed laser including an extended cavity emitting diode;

a first concave reflecting mirror for converging said beamlets to a focal point;

an integrating convex mirror placed at or near said focal point, said integrated convex mirror adapted for reflecting a first portion of said beamlets back toward said first reflecting mirror and for allowing a second portion of said beamlets through said integrating convex mirror; and a light transmitter adapted for transmitting said second portion of said beamlets from said integrating convex mirror, wherein said second portion of beamlets exit said light transmitter as a homogenized uniform laser beam having substantially uniform convergence and focus, wherein said seed laser is activated prior to any other diodes to form said focused laser beam.

34. The device of claim 33, wherein said seed laser is a Littman-Metcalf extended cavity diode laser.

35. A device for generating a focused laser beam, said device comprising:

a structural support;

a main laser diode array of a specific desired width and length including a plurality of diodes acting as laser emitters, wherein said array is mounted onto the structural support such that the output of the array is substantially parallel beamlets of laser energy;

a seed laser including an extended cavity diode that is activated separately from said main laser diode array for emitting a beam used for generating said laser beam;

a concave highly reflecting mirror placed at a designated distance in front of the array to receive the beamlets for reflecting and converging the beamlets of laser energy;

a convex optical mirror which is partially reflective for intercepting the reflected and converged beamlets of laser energy from said concave mirror with the convex surface of the convex optical mirror reflecting the converging array of beamlets back to the laser diode array; and a light transmitter comprising a light transport conduit.

36. The device of claim 35, wherein said device is adapted for generating a short pulse of one picosecond or less by activating said seed laser with said main laser diode array.

37. The device of claim 35, wherein said seed laser is activated prior to any of said main laser diodes lasers to form said focused laser beam.

* * * * *